US006166573A

United States Patent [19]

Moore et al.

[11] Patent Number: 6,166,573

[45] Date of Patent: Dec. 26, 2000

[54] HIGH RESOLUTION DELAY LINE

[75] Inventors: Kendall G. Moore, Tempe; Samuel L. Thomasson, Gilbert, both of Ariz.

[73] Assignee: Acoustic Technologies, Inc., Mesa, Ariz.

[21] Appl. No.: 09/361,014

[22] Filed: Jul. 23, 1999

[51] Int. Cl.[7] .......... H03M 1/12

[52] U.S. Cl. .......... 327/161; 327/152; 327/153; 327/269; 327/250; 327/270; 327/276; 365/194; 341/113; 341/145; 341/156

[58] Field of Search .......... 365/194; 327/152, 327/153, 161, 250, 269, 270, 276; 341/113, 145, 146

[56] References Cited

U.S. PATENT DOCUMENTS

| | | | |
|---|---|---|---|
| 4,829,491 | 5/1989 | Saugeon et al. | 367/103 |
| 4,903,241 | 2/1990 | Boudewijns | 365/194 |
| 4,982,196 | 1/1991 | Thomas et al. | 342/172 |
| 5,013,944 | 5/1991 | Fischer et al. | 307/603 |
| 5,095,262 | 3/1992 | Henley et al. | 324/73.1 |
| 5,148,175 | 9/1992 | Woolfolk | 342/95 |
| 5,237,224 | 8/1993 | Delisle et al. | 307/603 |
| 5,243,227 | 9/1993 | Gutierrez, Jr. et al. | 307/605 |
| 5,293,626 | 3/1994 | Priest et al. | 395/550 |
| 5,363,108 | 11/1994 | Fullerton | 342/27 |
| 5,453,710 | 9/1995 | Gilbert et al. | 327/277 |
| 5,521,599 | 5/1996 | McCarroll et al. | 341/122 |
| 5,578,917 | 11/1996 | Bottman | 324/76.15 |
| 5,619,504 | 4/1997 | Van Grinsven et al. | 370/347 |

*Primary Examiner*—Viet Q. Nguyen
*Attorney, Agent, or Firm*—Paul F. Wille

[57] ABSTRACT

A high resolution delay line includes a coarse delay having a minimum period of delay and a fine delay having a total delay, wherein the total delay is equal to or greater than half the minimum period. Each delay can be implemented in analog or digital form and the delay line can be implemented with one portion in analog form and the remainder in digital form. The digital delay can provide a delay upward of 1,500 milliseconds. The fine delay provides a resolution of ten microseconds or less. An unknown delay is measured by coupling a signal into two channels, wherein the first channel includes the unknown delay and the second channel includes the coarse delay and the fine delay. The output signals from the channels are correlated while adjusting the coarse delay for maximum correlation and then adjusting the fine delay for maximum correlation.

12 Claims, 4 Drawing Sheets

HIGH RESOLUTION DELAY LINE

CROSS-REFERENCE TO RELATED APPLICATION

This application contains common subject matter with application Ser. No. 10205.011, filed on even date herewith, and assigned to the assignee of this invention. The contents of said application are incorporated by reference herein.

BACKGROUND OF THE INVENTION

This invention relates to delay lines and, in particular to a delay line including a coarse delay and a fine delay to provide high resolution over relatively long periods with relatively few stages of delay.

In telephone systems and elsewhere, it is often desired to measure or match a particular delay, e.g. for echo cancellation. The distance that a signal is traveling causes a minimum delay. Digital calling apparatus further delays a signal in the digitizing process and in the batch (packet) mode that signals are often handled. Using a satellite relay can add considerably to the delay; a minimum of 250 milliseconds each way.

An echo is perceived if a delay is greater than 20–50 milliseconds. Digital packet transmission through a satellite can produce a delay in excess of 600 milliseconds. Modern network equipment is incapable of handling a delay longer than about 100 milliseconds. Acoustic delays, such as reverberations in a room, can be even longer, up to 1,500 milliseconds.

The sampling rate of analog to digital (A/D) converters in telephone systems is typically 8,000 samples per second. This number was chosen because of the relatively narrow bandwidth of a telephone system, 300–3,400 Hz, and because of the speed limitations of digital signal processing (DSP) devices. At 8,000 samples per second, the samples are separated by 125 microseconds and a 3.4 kilohertz signal is sampled only 2.3 times per cycle. This is not particularly good resolution.

In order to increase resolution, one must increase the number of samples, which causes a corresponding increase in the number of storage sites. The number of storage sites is limited by the cost of manufacturing suitable integrated circuits and the complexity of addressing the sites in real time.

In an analog system, the signals are not converted to digital data, which simplifies the circuitry. However, the storage time for the samples is presently limited by the characteristics of the storage node to approximately one half second without some sort of refreshing. For longer storage times, A/D conversion and memory storage are necessary.

A large number of storage sites adversely affects the time for the system to lock onto the delay, referred to herein as convergence. In a constantly changing environment, such as a telephone, system delays can change during a call and acoustic delays can change during a call because a person moves about a room. In the prior art, the settings for an echo canceling circuit are not changed during a call, largely due to a long convergence time.

In view of the foregoing, it is therefore an object of the invention to provide a high resolution delay line using relatively few storage elements or delay elements.

Another object of the invention is to provide a high resolution delay line that enables a system incorporating the delay line to converge quickly.

A further object of the invention is to provide a high resolution delay line capable of delaying a signal for one second or more.

Another object of the invention is to provide a high resolution delay line that can be implemented in either analog form, digital form, or a mixture of the two.

SUMMARY OF THE INVENTION

The foregoing objects are achieved in this invention in which a delay line includes a coarse delay having a minimum period of delay and a fine delay having a maximum total delay, wherein the maximum total delay is greater than the minimum period. Each delay can be implemented in analog or digital form and the delay line can be implemented with one portion in analog form and the remainder in digital form. The coarse delay provides a delay upward of 1,500 milliseconds. The fine delay provides a resolution of ten microseconds or less. An unknown delay is measured by coupling a signal into two channels, wherein the first channel includes the unknown delay and the second channel includes the coarse delay and the fine delay. The output signals from the channels are correlated while adjusting the coarse delay for maximum correlation and then adjusting the fine delay for maximum correlation.

BRIEF DESCRIPTION OF THE DRAWINGS

A more complete understanding of the invention can be obtained by considering the following detailed description in conjunction with the accompanying drawings, in which.

DETAILED DESCRIPTION OF THE INVENTION

Figure 1:
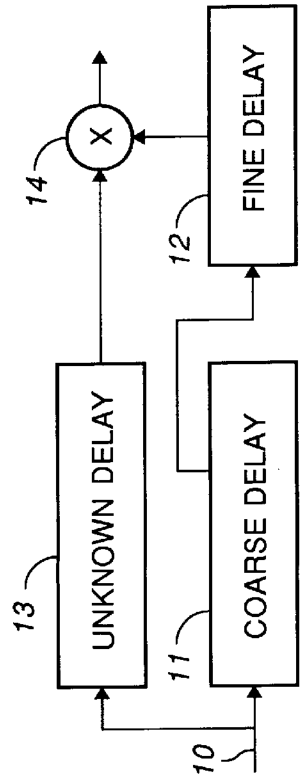
FIG. 1 illustrates a system employing the invention to measure an unknown delay.

FIG. 1 illustrates a preferred embodiment of the invention in which coarse delay 11 and fine delay 12 are combined to provide a high resolution measurement of unknown delay 13 without a correspondingly large number of storage sites. The signals are compared in correlator 14 and the coarse delay is adjusted for maximum correlation. The fine delay is then adjusted to increase correlation even more.

Figure 2:
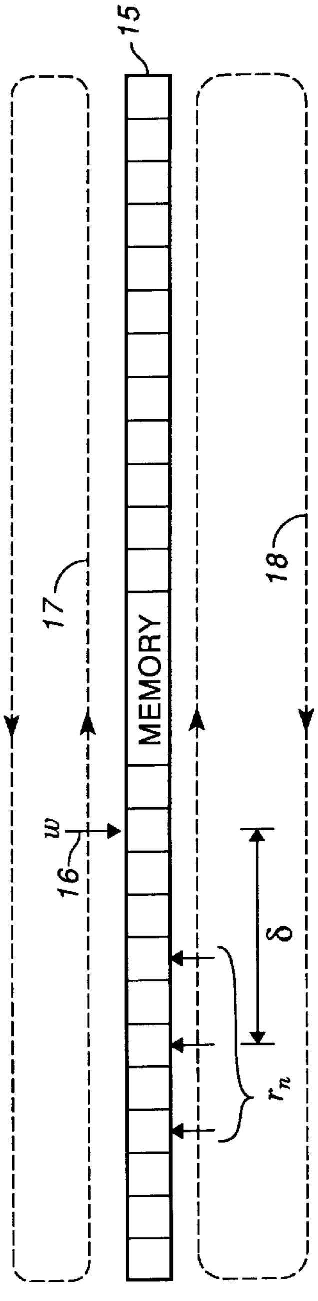
FIG. 2 schematically illustrates the operation of a system constructed in accordance with the invention.

The operation of coarse delay 11 is illustrated in FIG. 2. Memory 15, which can be analog or digital, includes a plurality of storage sites that are consecutively addressed and written by suitable means, represented by arrow 16. As indicated by dashed line 17, arrow 16 moves in the direction indicated to address memory 15 sequentially and repeatedly.

The data is read by suitable apparatus following arrow 16, thereby introducing a delay into the signal from memory 15. The delay can be considerable, in excess of 500 milliseconds. Sampled at 8,000 samples per second with 12-bit resolution, memory 15 need only store 48,000 bits of data (48,000 storage sites, preferably addressed as words containing several bits) for one half second of data. Such memory is readily available and can easily fit into a cellular telephone, for example. In analog form, only 4,000 storage sites are needed for memory 15.

The number of storage sites between the write pointer and the read pointer is directly proportional to delay, represented as delta (δ) in FIG. 2. In accordance with the invention, three storage sites are read simultaneously. The three sites need not be consecutive but the second site is preferably midway between the first site and the third site.

Figure 3:
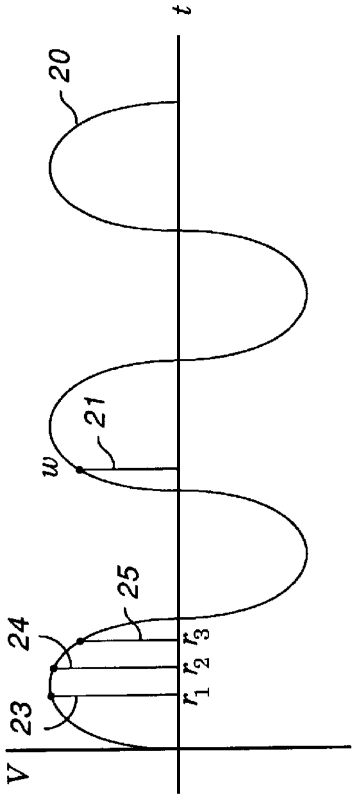
FIG. 3 illustrates the operation of the invention upon a sinusoidal signal.

The read operation is best understood by considering FIG. 3. Signal 20, which can have any waveform, is sampled and written to memory at a time indicated by pointer 21. The signal is later read at times indicated by pointers 23, 24, and 25. The three signals are correlated with the signal from unknown delay 13 (FIG. 1) to indicate in which direction to adjust the delay. If, for example, the signal from pointer 23 has the highest correlation, then the delay is increased (greater separation from write pointer 21) until the highest correlation is obtained at pointer 24.

Correlation should not be confused with the amplitude of the signal. The delayed signal is being read as the pointers move from left to right, as indicated by dashed line 18 in FIG. 2 and correlation may take place over several cycles of the signal from unknown delay 13. In fact, with a delay line constructed in accordance with the invention, convergence takes place in fifty milliseconds or less (within one hundred seventy cycles of a 3,400 Hz signal). Systems of the prior art converge in 500–3,000 milliseconds.

Figure 4:
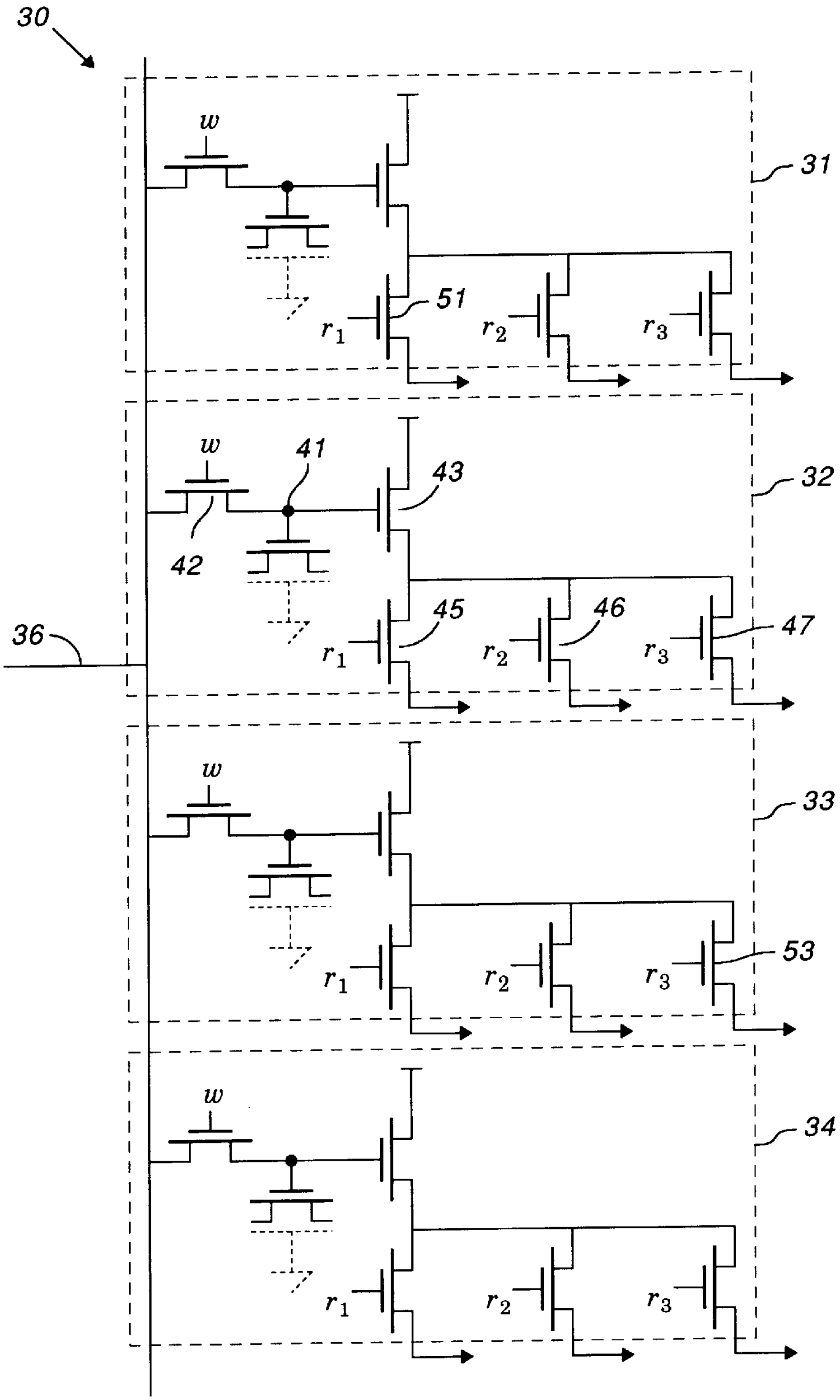
FIG. 4 is a schematic of an analog delay line constructed in accordance with the invention.

FIG. 4 illustrates an analog implementation of delay line 11 (FIG. 1). Memory 30 includes a plurality of substantially identical storage sites, such as sites 31, 32, 33, and 34, connected in parallel to input 36. Input 36 corresponds to input 10 (FIG. 1) or may be coupled to input 10 by intermediate buffers, filters, and the like.

Storage site 32 includes storage node 41 coupled to input 36 by write gate 42. Storage node 41 is preferably the gate of an isolated FET (field effect transistor) that exhibits a capacitance relative to ground or common. The amplitude of the input signal is stored on node 41 during the moment that gate 42 is open. Node 41 is coupled through source follower 43 to read gates 45, 46, and 47. These read gates are never open simultaneously, although read gates 51, 46, and 53 may be open simultaneously.

A preferred embodiment of the invention includes differential voltages for improved performance. Thus, there are actually twice as many storage sites, one half for the signal and one half for the inverted signal. In a read operation, the difference in voltage between node 41 and the corresponding opposite node is read.

Figure 5:
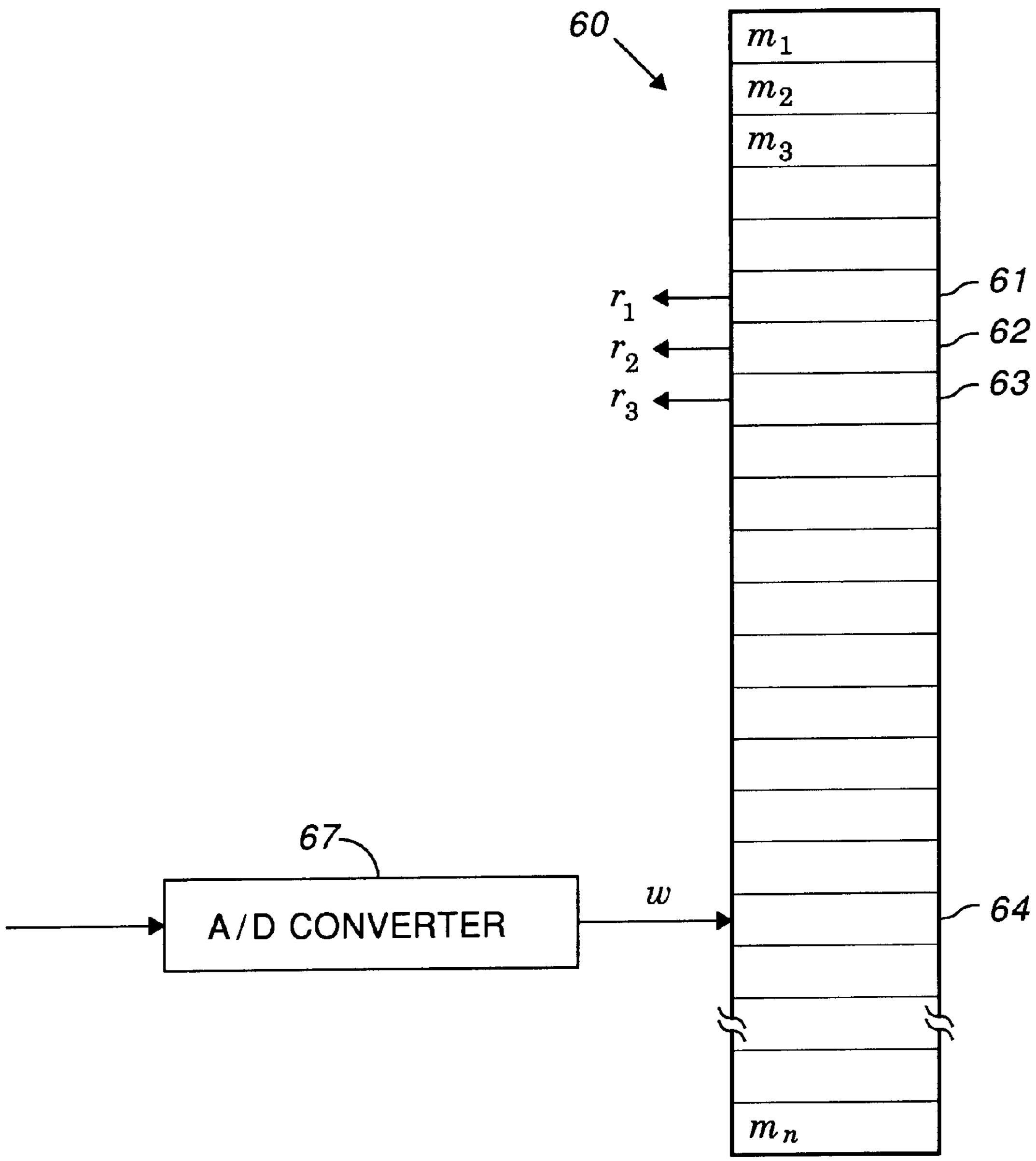
FIG. 5 is a block diagram of a digital delay line constructed in accordance with the invention.

FIG. 5 illustrates a digital implementation of delay line 11 (FIG. 1). Memory 60 includes a plurality of storage sites, such as sites 61, 62, 63, and 64. Each site has a unique address and includes a plurality of bits, as determined by the construction of the particular integrated circuit. Preferably, each "word" or group of bits corresponds to the resolution of the A/D converter used for writing data, e.g. twelve bits. The data is preferably stored in sequential addresses but need not be.

A/D converter 67 is coupled to input 10 (FIG. 1) by buffers, filters, and the like. An input signal is sampled and the amplitude of the sample is converted into a digital number that is stored in memory 60, e.g. at site 64. Data is read in the same order in which it was stored. As with the analog version, the number of sites between the read pointer and the write pointer determines the delay. The actual amount of delay, in seconds, depends also upon the clock rate.

Fine delay 12 (FIG. 1) is constructed and operated in the same manner as coarse delay 11, with two exceptions. The sample rate is much higher, 100 kHz to 1 MHz or more, and there is only one read line, not three. In one embodiment of the invention, the fine delay is scanned from end to end while monitoring the correlation coefficient for maximum correlation. Alternatively, one can use successive approximation, where the fine delay is preset to midrange and then increased or decreased to obtain maximum correlation.

In one embodiment of the invention, coarse delay 11 operated at 8,000 Hz. and stored 4,000 samples (500 millisecond maximum delay). Fine delay 12 operated at 800,000 Hz and stored 400 samples (0.5 millisecond maximum delay). Note how little additional storage is required to provide the fine delay. Note too that the minimum coarse delay, 0.125 milliseconds, is less than the total fine delay. Thus, in this example, the fine delay can divide each coarse delay period into one hundred smaller periods, with overlap at each end to ensure continuity. The total fine delay is preferably equal to or greater than one half the minimum coarse delay.

Other combinations of sample rates can provide a wide range of delays and resolutions and, most importantly, can provide delays as long as 1.5 seconds or more at a resolution of tens of microseconds or less. This enables one to match phases to within less than one degree at 3,400 Hz. Further, one can combine digital coarse delay with an analog fine delay to provide a relatively easily implemented, inexpensive, yet precise system.

Figure 6:
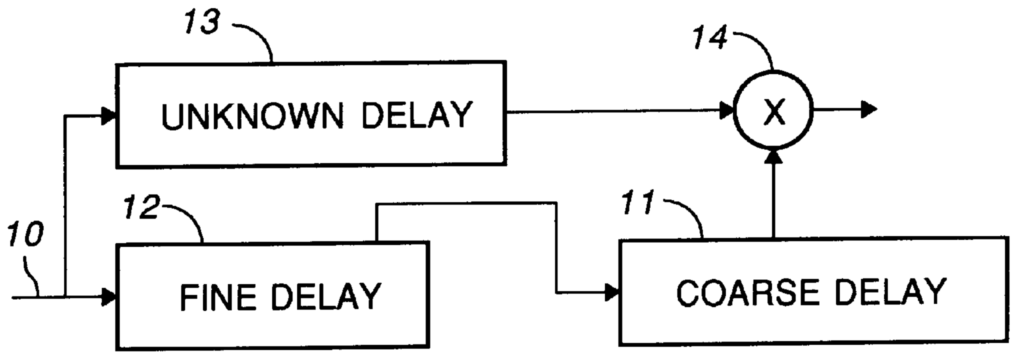
FIG. 6 illustrates measuring delay in accordance with another aspect of the invention.
Figure 7:
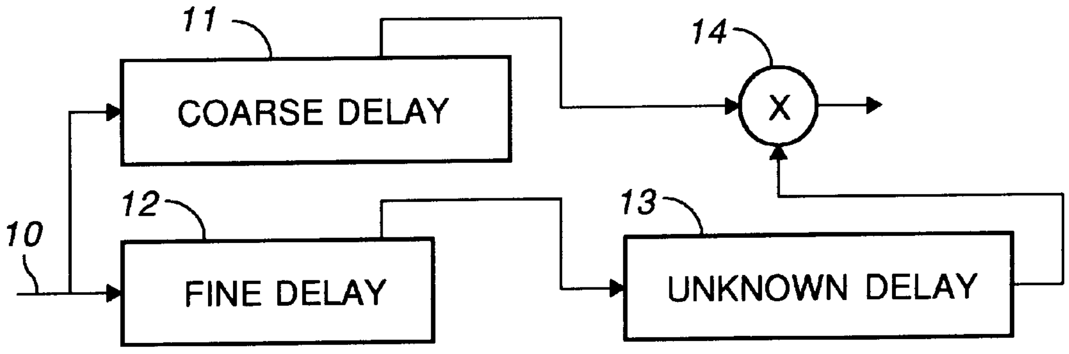
FIG. 7 is an alternative embodiment of FIG. 6.

FIGS. 6 and 7 illustrate alternative embodiments of FIG. 1 and highlight additional aspects of the invention. In FIG. 6, the locations of the coarse delay and the fine delay are switched as compared to FIG. 1. In principle, this change should have no effect on the operation of the invention. In fact, the effect depends on the nature of the filter preceding the fine delay. If a clocked or switched filter is being used, such a filter should operate at the same frequency as fine delay 12, 100 kHz to 1 MHz or more. Such a filter is quite expensive and difficult to make. Thus, in a digital or quantized system, fine delay 12 should follow coarse delay 11.

FIGS. 1 and 6 have an advantage in that the channel with the unknown delay has a continuous signal, as opposed to a sampled signal, and the correlation is more accurate. Further, the channel with the known delay can be analog or digital as desired. In FIG. 7, the signals in both channels are sampled and these advantages are not obtained.

The system illustrated in FIG. 7 has an additional deficiency in that any adjustment in delay must propagate through the unknown delay before correlation. This can significantly slow convergence. Thus, the embodiment of FIG. 1 is preferred.

The invention thus provides a high resolution delay line using relatively few storage elements or delay elements that converges quickly. The high resolution delay line is capable of delaying a signal for one second or more and can be implemented in either analog form, digital form, or a mixture of the two.

Having thus described the invention, it will be apparent to those of skill in the art that various modifications can be made within the scope of the invention. For example, the number of storage sites, analog or digital, can be adjusted to suit a particular application. A digital delay line constructed in accordance with the invention uses addressed memory to store amplitude information. The data does not move through memory as with a shift register. The period between write and read determines delay, not the frequency of the shift clock input as in a shift register. A shift register is serial memory shifting bits that are either one or zero whereas the invention uses addressed memory for simultaneously storing groups of bits representing amplitude. There are several types of correlator that can be used for implementing the invention. The most complicated correlator is a full multiplier circuit. The simplest correlator is a gate for selectively passing or blocking a signal. A circuit of intermediate complexity is a binary phase shift modulator. This circuit reverses the polarity of a first signal in accordance with a second signal.

What is claimed as new is:

1. A high resolution delay line comprising:

a coarse delay having a minimum period of delay;

a fine delay having a maximum total delay;

wherein said maximum total delay is equal to or greater than one half said minimum period;

a memory for storing data;

analog to digital conversion means for converting an input signal into data and writing the data in said memory; and means for reading said memory a predetermined time after the data is written.

2. The delay line as set forth in claim 1 wherein said memory is large enough to store more than one second of signal from said analog to digital converter.

3. A high resolution delay line including a coarse delay having a minimum period of delay and a fine delay having a maximum total delay, wherein said maximum total delay is equal to or greater than one half said minimum period, wherein one of said coarse delay and said fine delay is an analog delay comprising:

a plurality of storage nodes;

a write circuit for storing charge on said storage nodes; and a read circuit for sensing data on said storage nodes.

4. A high resolution delay line including a coarse delay having a minimum period of delay and a fine delay having a maximum total delay, wherein said maximum total delay is equal to or greater than one half said minimum period, wherein said coarse delay is a digital delay comprising:

a memory for storing data;

analog to digital conversion means for converting an input signal into data and writing the data in said memory; and means for reading said memory a predetermined time after the data is written.

5. The delay line as set forth in claim 4 wherein said fine delay is an analog delay comprising:

a plurality of storage nodes;

a write circuit for storing charge on said storage nodes; and a read circuit for sensing data on said storage nodes.

6. The delay line as set forth in claim 5 wherein said memory is large enough to store more than one second of signal from said analog to digital converter.

7. A method for determining an unknown delay, said method comprising the steps of:

coupling a signal into two channels, wherein a first channel includes a coarse delay means and the second channel includes the unknown delay;

correlating the output signals from the channels;

adjusting the coarse delay for maximum correlation;

adding a fine delay to one of the channels; and adjusting the fine delay for maximum correlation.

8. The method as set forth in claim 7 wherein the coarse delay has a minimum period of delay;

the fine delay has a maximum total delay;

and the maximum total delay is equal to or greater than one half the minimum period.

9. The method as set forth in claim 7 wherein said adding step includes the step of adding the fine delay to the channel including the coarse delay.

10. The method as set forth in claim 7 wherein said adjusting step includes the step of sweeping the fine delay from minimum delay to maximum delay.

11. The method as set forth in claim 7 wherein said adjusting step includes the step of sweeping the fine delay from maximum delay to minimum delay.

12. The method as set forth in claim 7 wherein said adjusting step includes the step of adjusting the fine delay by successive approximation.

* * * * *

UNITED STATES PATENT AND TRADEMARK OFFICE

CERTIFICATE OF CORRECTION

PATENT NO. : 6,166,573
DATED : December 26, 2000
INVENTOR(S) : Moore et al.

It is certified that error appears in the above-identified patent and that said Letters Patent is hereby corrected as shown below:

Claim 1 should read as follows.

1. A high resolution delay line comprising:
a coarse delay having a minimum period of delay;
a fine delay having a maximum total delay;
wherein said maximum total delay is equal to or greater than one half said minimum period; and
wherein one of said coarse delay and said fine delay is a digital delay including
a memory for storing data;
analog to digital conversion means for converting an input signal into data and writing the data in said memory; and
means for reading said memory a predetermined time after the data is written.

Signed and Sealed this

Ninth Day of October, 2001

*Attest:*

Nicholas P. Godici

NICHOLAS P. GODICI

*Attesting Officer*

*Acting Director of the United States Patent and Trademark Office*